(12) United States Patent
Winger et al.

(10) Patent No.: US 7,660,355 B2
(45) Date of Patent: Feb. 9, 2010

(54) LOW COMPLEXITY TRANSCODING BETWEEN VIDEO STREAMS USING DIFFERENT ENTROPY CODING

(75) Inventors: Lowell L. Winger, Waterloo (CA); Eric C. Pearson, Conestogo (CA)

(73) Assignee: LSI Corporation, Milpitas, CA (US)

( * ) Notice: Subject to any disclaimer, the term of this patent is extended or adjusted under 35 U.S.C. 154(b) by 787 days.

(21) Appl. No.: 10/898,125

(22) Filed: Jul. 23, 2004

(65) Prior Publication Data

US 2005/0147173 A1 Jul. 7, 2005

Related U.S. Application Data

(63) Continuation-in-part of application No. 10/739,829, filed on Dec. 18, 2003.

(51) Int. Cl.
*H04N 7/12* (2006.01)
*H04N 11/02* (2006.01)
*H04N 11/04* (2006.01)
*G06K 9/46* (2006.01)
*H03M 7/34* (2006.01)
*H03M 7/38* (2006.01)
*H03M 7/40* (2006.01)

(52) U.S. Cl. ............... 375/240.23; 375/240.01; 375/240.03; 382/244; 382/245; 382/246; 382/247; 341/51; 341/65; 341/67

(58) Field of Classification Search ............ 375/240.01, 375/240.23, 240.25; 341/51, 67, 65; 382/244–247
See application file for complete search history.

(56) References Cited

U.S. PATENT DOCUMENTS

| | | | |
|---|---|---|---|
| 4,075,622 A * | 2/1978 | Lawrence et al. | 341/67 |
| 5,596,376 A * | 1/1997 | Howe | 348/718 |
| 5,850,482 A * | 12/1998 | Meany et al. | 382/232 |
| 6,304,607 B1 * | 10/2001 | Talluri et al. | 375/240.27 |
| 6,646,578 B1 * | 11/2003 | Au | 341/67 |
| 6,744,387 B2 | 6/2004 | Winger | |
| 7,158,684 B2 * | 1/2007 | Cheung et al. | 382/246 |
| 7,209,059 B2 * | 4/2007 | Lim et al. | 341/67 |
| 2001/0024529 A1 * | 9/2001 | Chao et al. | 382/240 |
| 2003/0215018 A1 * | 11/2003 | MacInnis et al. | 375/240.25 |
| 2004/0114683 A1 * | 6/2004 | Schwarz et al. | 375/240.2 |
| 2004/0136457 A1 * | 7/2004 | Funnell et al. | 375/240.01 |
| 2005/0147173 A1 * | 7/2005 | Winger et al. | 375/240.23 |

* cited by examiner

*Primary Examiner*—Marsha D Banks Harold
*Assistant Examiner*—Chikaodili E Anyikire
(74) *Attorney, Agent, or Firm*—Christopher P. Maiorana, PC

(57) ABSTRACT

A method for transcoding between video streams using different entropy coding, comprising the steps of (A) decoding a first video stream using a first set of entropy codes, and (B) generating a second video stream by entropy encoding the decoded first video stream using a second set of entropy codes. The first set of entropy codes and the second set of entropy codes are configured to represent all valid coefficient values of the first video stream.

22 Claims, 5 Drawing Sheets

LOW COMPLEXITY TRANSCODING BETWEEN VIDEO STREAMS USING DIFFERENT ENTROPY CODING

This is a continuation in part of U.S. Ser. No. 10/739,829, filed Dec. 18, 2003, which is hereby incorporated by reference in its entirety.

FIELD OF THE INVENTION

The present invention relates to video compression generally and, more particularly, to a method and/or apparatus for low complexity transcoding between video streams using different entropy coding.

BACKGROUND OF THE INVENTION

Digital video data is compressed for many applications. Transmission over limited bandwidth channels such as direct broadcast satellite (DBS) and storage on optical media (i.e., CD, DVD, etc.) are typical examples. In order to achieve efficient compression, complex, computationally intensive processes are used for encoding (or compressing) and decoding (or decompressing) the digital video data. One conventional standard for compressing video is MPEG-2. However, other compression standards, such as H.264, are being developed. H.264 compression obtains high efficiency in compression. H.264 compression uses only 50-60% of the bit rate used by MPEG-2 compression to provide the same quality of video.

Video data compression methods use some form of entropy coding. Motion vectors and other overhead such as transform coefficients are compressed using entropy coding. There are many types of well known entropy coding techniques, including Huffman coding and Context-based Adaptive Binary Arithmetic Coding (CABAC). For example, MPEG-2 uses Huffman encoding, whereas H.264 supports both Huffman and CABAC encoding. While CABAC is more efficient than Huffman encoding, CABAC uses significantly more processing power. This is particularly true for a real-time encoder or decoder that processes each picture in a bounded amount of time.

CABAC encoding and decoding is a multi-step, serial process. It is difficult to speed up the CABAC encoding and decoding process with parallel hardware. In high definition video, an entire second of compressed video data can be concentrated in one frame (i.e., one-thirtieth of a second). When the compressed video data is concentrated in one frame, the bit rate of the one second of compressed data is uneven. An uneven bit rate can make CABAC encoding and decoding difficult.

One conventional approach to the problem includes running the encoding/decoding hardware at a high frequency to handle the uneven bit rate problem. Disadvantages of the conventional approaches include high power consumption associated with high speed hardware. Also, frames can be dropped if the processing hardware cannot handle the data burst. High power devices are often not suitable for consumer products. In order to achieve the increased compression offered by CABAC, many sophisticated, processing intensive tools are used. Additionally, the hardware for encoding and decoding can be very complicated if parallel processing structures are implemented.

Conventional approaches transcode between different video formats to first decode the bitstream to get baseband video. The video is then re-encoded into the new format. Conventional approaches use many methods to reduce the complexity of the re-encoding by re-using syntax elements from the decoded video to aid the re-encoding of the video.

Unlike other conventional video standards that contained only one entropy coding solution, the H.264 standard allows transcoding a context adaptive variable length coded (CAVLC) entropy-encoded H.264 video stream to make a context adaptive binary arithmetic coded (CABAC) entropy-encoded H.264 video stream by entropy-decoding the CAVLC stream to get the syntax element values. The syntax element values are entropy-encoded with the CABAC method of entropy coding.

Since such conventional transcoding does not use a complete H.264 decode and H.264 re-encode, the transcoding from CAVLC to CABAC can be done very cheaply (or inexpensively). The cheap transcoding method for CAVLC-to-CABAC is only possible because CABAC is capable of directly representing all values of all syntax elements in a CAVLC bitstream. However, the same property does not hold when attempting to transcode a CABAC stream to produce a CAVLC stream because, in the standard ITU-T Rec. H.264|ISO/IEC 14496-10 AVC (aka H.264), CABAC is capable of representing 15 and 16-bit quantized coefficient values while CAVLC can represent only up to 12.3-bit quantized coefficient values.

It would be desirable to provide a method for encoding and/or decoding a compressed video stream that uses an entropy encoding method in a manner that is well suited for low-cost, low-power, and/or real-time devices.

SUMMARY OF THE INVENTION

The present invention concerns a method for transcoding between video streams using different entropy coding, comprising the steps of (A) decoding a first video stream using a first set of entropy codes, and (B) generating a second video stream by entropy encoding the decoded first video stream using a second set of entropy codes. The first set of entropy codes and the second set of entropy codes are configured to represent all valid coefficient values of the first video stream.

The objects, features and advantages of the present invention include providing low complexity transcoding between video streams using different entropy coding that may provide (i) an inexpensive CABAC-to-CAVLC transcoder using extended CAVLC codes, (ii) an inexpensive extended-CAVLC-to-CABAC transcoder using extended CAVLC codes, (iii) an inexpensive CABAC-to-CAVLC transcoder that clips coefficient values,(iv) a CABAC encoder that clips all coefficients to a range that is representable by CAVLC codes (e.g., approximately 12 bits for H.264, but may be different for each sample bit depth of the H.264/PExt standard) and/or (v) an extended set of CAVLC codes capable of representing larger coefficients.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may solve the problem of how to cheaply (e.g., cost effectively) transcode between two different types of H.264 bitstreams. Namely, how to economically transcode a context adaptive binary arithmetic coded (CABAC) entropy-encoded H.264 bitstream into a context adaptive variable length coded (CAVLC) entropy-encoded H.264 bitstream.

The present invention may also have a practical implication for encoders using CAVLC as an intermediate format during CABAC encoding. For example, the present invention may be used in an encoder that (i) includes a low-cost CAVLC-to-CABAC transcoder to reduce the cost of a CABAC encoder, (ii) achieves very high bit rate CABAC encoding rates, and (iii) may be implemented without excessive silicon cost.

Figure 1:
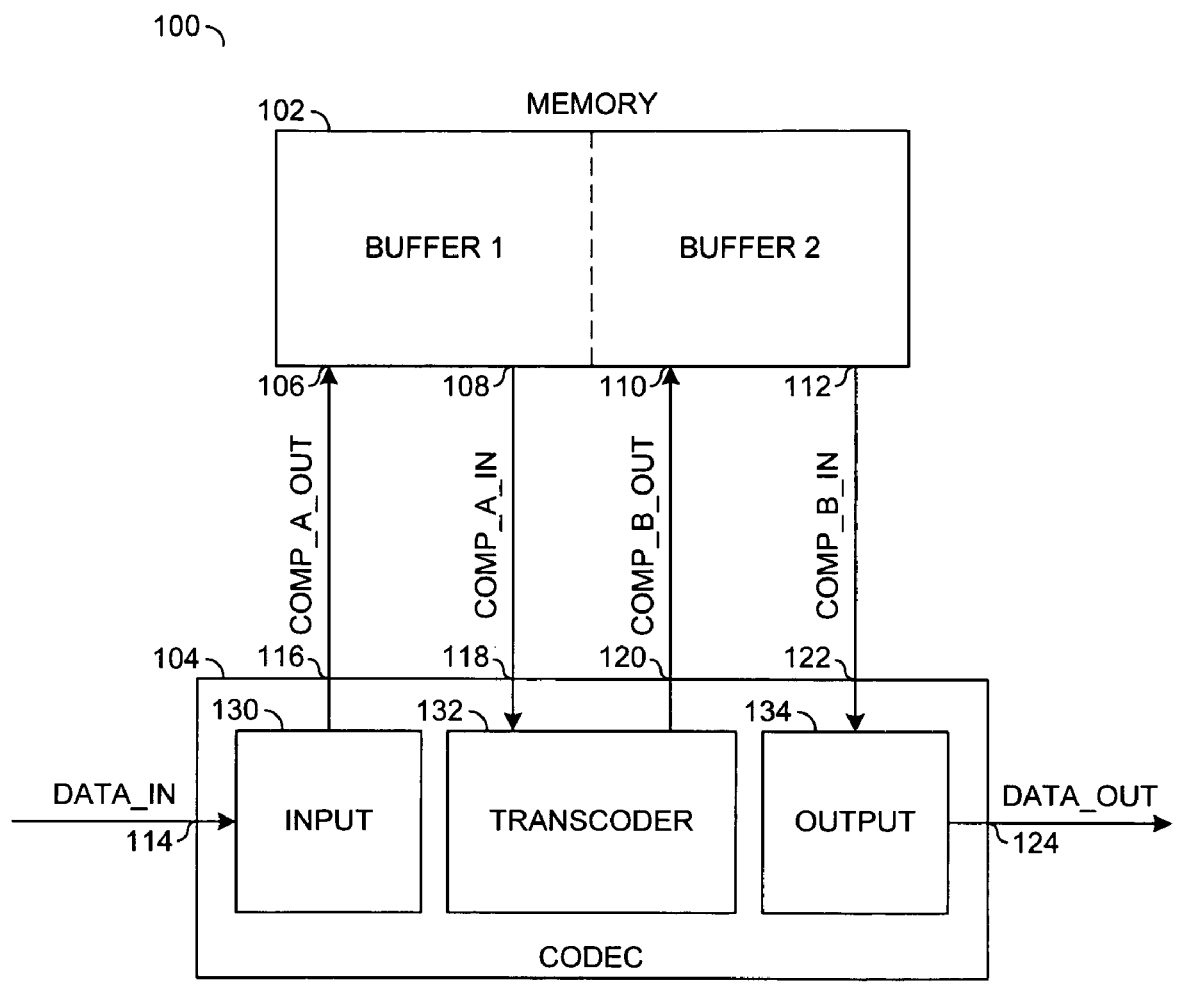
FIG. 1 is a block diagram of a preferred embodiment of the present invention.

Referring to FIG. 1, a block diagram of a circuit 100 is shown illustrating a preferred embodiment of the present invention. The circuit 100 generally provides an encoder/decoder architecture for high quality video compression and decompression that may be configured to use context-based adaptive binary arithmetic coding (CABAC). The circuit 100 generally receives an input signal (e.g., DATA_IN) and generates an output signal (e.g., DATA_OUT). When the circuit 100 is implemented as an encoder circuit, the signal DATA_IN may comprise uncompressed data (e.g., video, audio, etc.) to be compressed and the signal DATA_OUT may comprise a compressed data (or bit) stream (e.g., for transmission or storage). When the circuit 100 is implemented as a decoder circuit, the signal DATA_IN may comprise a compressed data (or bit) stream (e.g., MPEG-4, H.264, etc. compressed video) and the signal DATA_OUT may comprise an uncompressed data stream (e.g., video, audio, data, etc.).

The circuit 100 generally comprises a circuit 102 and a circuit 104. The circuit 102 may be implemented as a memory circuit. The circuit 104 may be implemented as an encoder, a decoder or an encoder/decoder (CODEC) circuit (or block). The circuit 102 may comprise a first portion (e.g., BUFFER1) and a second portion (e.g., BUFFER2). In one example, BUFFER1 and BUFFER2 may be implemented as sections of a single memory device. Alternatively, BUFFER1 and BUFFER2 may be implemented as individual memory devices. In one example, BUFFER1 and BUFFER2 may be implemented as first-in first-out (FIFO) memories.

The circuit 102 may have an input 106 that may receive a signal (e.g., COMP_A_OUT), an output 108 that may present a signal (e.g., COMP_A_IN), an input 110 that may receive a signal (e.g., COMP_B_OUT), and an output 112 that may present a signal (e.g., COMP_B_IN). The signals COMP_A_OUT and COMP_A_IN may communicate a first representation of data compressed in a first format (e.g., Huffman coding, CABAC, H.264, etc.). The circuit 102 may be configured to receive the compressed data in the first format via the signal COMP_A_OUT, store the data, retrieve the data and present the compressed data via the signal COMP_A_IN. The circuit 102 may be configured to store the compressed data received via the signal COMP_A_OUT in BUFFER1.

The signals COMP_B_OUT and COMP_B_IN may comprise a second representation of data, compressed using a second compression format (e.g., Huffman coding, CABAC, H.264, etc.). The circuit 102 may be configured to store the compressed data received via the signal COMP_B_OUT in BUFFER2. The circuit 102 may be configured to present the compressed data stored in BUFFER2 via the signal COMP_B_IN.

The circuit 104 may have an input 114 that may receive the signal DATA_IN, an output 116 that may present the signal COMP_A_OUT, an input 118 that may receive the signal COMP_A_IN, an output 120 that may present the signal COMP_B_OUT, an input 122 that may receive the signal COMP_B_IN, and an output 124 that may present the signal DATA_OUT. The circuit 104 may be configured to generate the signal COMP_A_OUT in response to the signal DATA_IN. The circuit 104 may be configured to generate the signal COMP_B_OUT in response to the signal COMP_A_IN. The circuit 104 may be configured to generate the signal DATA_OUT in response to the signal COMP_B_IN. The circuit 104 may be configured to generate one or more control signals for controlling the data flow to and from the circuit 102.

The circuit 104 generally comprises a circuit 130, a circuit 132 and a circuit 134. The circuit 130 may be implemented as an input circuit. The circuit 132 may be implemented as a transcoder circuit. The circuit 134 may be implemented as an output circuit. In one example, the circuit 130 may be implemented as a bitstream capture unit. Alternatively, the circuit 130 may be implemented as a video encoding circuit.

In one example, the circuit 132 may be configured to translate data between a first representation of data (e.g., a context-based adaptive binary arithmetic coding scheme) and a second representation of the data (e.g., a simpler entropy coding scheme, such as Huffman, non-CABAC H.264, etc.). Alternatively, the circuit 132 may be configured to translate data from the simpler entropy coding scheme into the context-based adaptive binary arithmetic coding scheme. For example, the circuit 132 may be configured to translate directly from the context-based adaptive binary arithmetic coding scheme to a simpler entropy coding scheme (e.g., Huffman coding or non-CABAC encoding scheme). In one example, two formats may be implemented for the simpler compressed format: a) binarized but not CABAC and/or b) Huffman for coefficients and binarized but not CABAC for the rest. The first format may be symbols that use the same variable-length binarization as H.264 CABAC but without arithmetic coding. The second format may be an H.264 representation using the Huffman (e.g., not CABAC) option for entropy encoding.

In general, the circuit 132 comprises a lossless entropy transcoder. Entropy encoding generally refers to representing a set of symbols in a way that the symbols can be exactly recovered from the representation. Furthermore, based on a statistical model, the representation generally uses, on average, fewer bits than the direct way of representing the data. The circuit 132 generally performs an entropy decode (e.g., a Huffman decode, a CABAC decode, etc.) on the signal COMP_A_IN and an entropy encode on the result of the decode operation (e.g., with a Huffman encode, CABAC encode, non-CABAC encode, etc.) for presentation as the signal COMP_B_OUT.

The circuit 134 may be implemented, in one example, as a real time video decoder circuit. In this example, the circuit 134 generally comprises a variable length code (VLC) decoder, dequantization unit, and inverse transform unit that can be used to reconstruct pictures from a compressed bitstream. In a second example, the circuit 134 may be implemented as video transmission unit.

Figure 2:
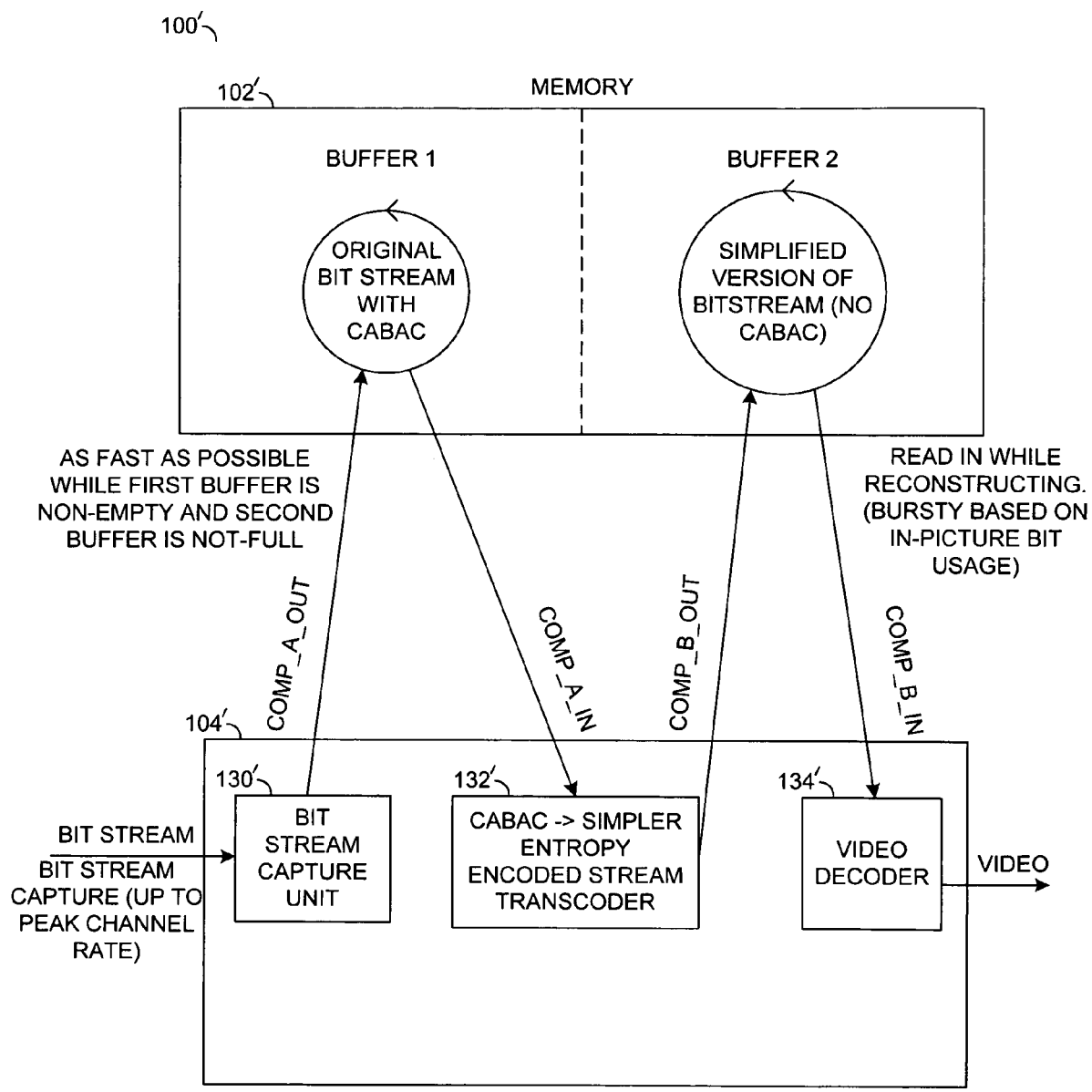
FIG. 2 is a block diagram of a decoder architecture/process in accordance with a preferred embodiment of the present invention.

Referring to FIG. 2, a block diagram of a circuit 100' is shown illustrating a decoder application in accordance with a preferred embodiment of the present invention. In one example, the circuit 100' may comprise a single integrated circuit (IC) decoder chip 104' and an external memory chip 102'. The circuit 102' may be implemented similarly to the circuit 102. The circuit 104' may comprise a circuit 130', a circuit 132' and a circuit 134'. The circuit 130' may be implemented as a bitstream capture unit. The circuit 132' may be implemented as a transcoder circuit. The circuit 134' may be implemented as a real-time video decoder circuit.

The circuit 130' may be configured to receive a compressed data bitstream (e.g., a signal BITSTREAM) and store the bitstream in a first buffer implemented in the memory 102'. The circuit 132' may be configured to (i) retrieve the bitstream from the memory 102', (ii) convert encoded data (e.g., encoded with CABAC) into a simpler encoded bitstream (e.g., without CABAC) and (iii) store the simpler encoded bitstream into a second buffer implemented in the memory 102'. The circuit 134' may be configured to (i) retrieve the simpler encoded bitstream from the second buffer and (ii) decode the bitstream, in one example, into video stream (e.g., a signal VIDEO). The circuit 130' is generally configured to store the bitstream as fast as possible while the first buffer is non-empty and the second buffer is not full. Data is generally read from the second buffer while being reconstructed. In general, the second buffer may be sized to hold approximately one second of video. The data from the second buffer may be bursty based on, for example, in-picture bit usage.

Figure 3:
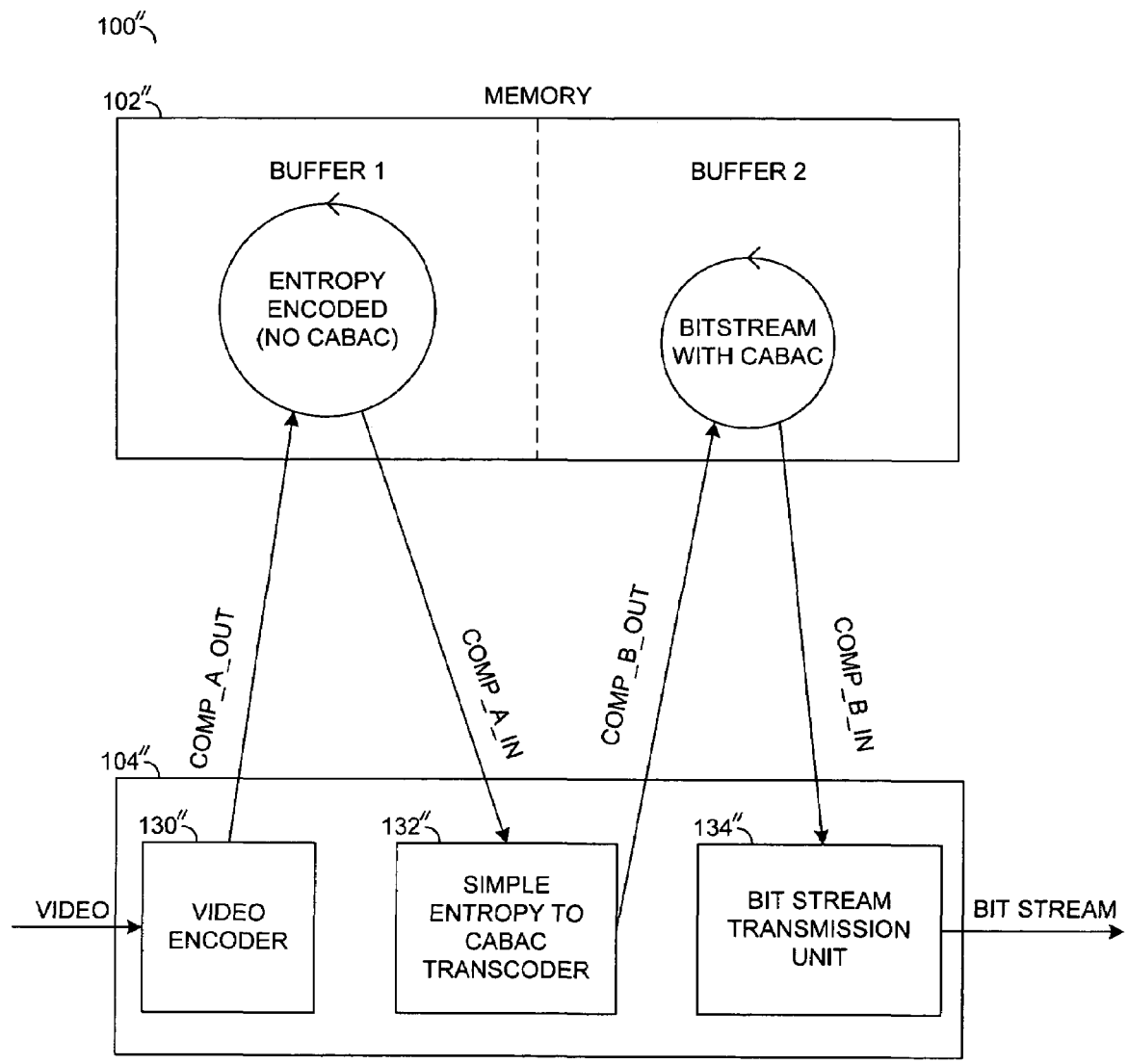
FIG. 3 is a block diagram of an encoder architecture/process in accordance with a preferred embodiment of the present invention.

Referring to FIG. 3, a block diagram of a circuit 100" is shown illustrating an encoder application in accordance with a preferred embodiment of the present invention. In one example, the circuit 100" may comprise a single integrated circuit (IC) decoder chip 104" and an external memory chip 102". The circuit 102" may be implemented similarly to the circuit 102. The circuit 104" may comprise a circuit 130", a circuit 132" and a circuit 134". The circuit 130" may be implemented, in one example, as a real-time video encoder. The circuit 132" may be implemented as a transcoder circuit. The circuit 134" may be implemented as a bitstream transmission unit.

The circuit 130" may be configured to (i) receive an uncompressed video stream, encode the video stream with, for example, entropy coding (e.g., Huffman, universal variable length code (UVLC), etc.), and (iii) store the encoded data stream in a first buffer implemented in the memory 102". The circuit 132" may be configured to (i) retrieve the encoded data from the memory 102", (ii) convert encoded data (e.g., with no CABAC) into a more compact encoded bitstream (e.g., with CABAC) and (iii) store the further compressed data stream into a second buffer implemented in the memory 102". The circuit 134" may be configured to (i) retrieve the compressed data stream from the second buffer and (ii) and transmit the compressed data bitstream (e.g., as the signal BITSTREAM).

The present invention includes several implementations. First, for CAVLC-to-CABAC transcoding, an inexpensive transcoder may be implemented for CAVLC entropy-decoding followed by CABAC entropy-encoding. For CAVLC-to-CABAC transcoding, none of the other standard blocks of an encoder or decoder are needed (e.g., (inverse)transform, (inverse)quantization, etc. may be skipped).

Second, for the PExt version of the H.264 standard (e.g., aka H.264/PExt) CAVLC codes may either (a) represent all valid coefficient values that CABAC can (e.g., up to 15 bits for H.264 and for 8-bit video with H.264/PExt, up to (15+X) bits for (8+X) bit H.264/PExt sample bit depth video, where X is a positive integer) or (b) represent all coefficient values that can be produced from encoding of residuals that are one bit greater in size than the bit depth of the video format in use (e.g., for 8-bit video, 9-bit residuals are naturally the largest residuals that would be expected from standard encoding methods). The H.264 standard does not limit bitstreams to contain only 9-bit residuals, so that a pathological bitstream for 8-bit video may possibly contain larger residuals.

In the case of (a), a completely standard compliant CABAC-to-CAVLC transcoder may be cheaply implemented by CABAC entropy decoding followed by CAVLC entropy encoding. In this case the present invention may implement both an inexpensive standard compliant transcoder, and the extended CAVLC codes that enable CAVLC to represent all CABAC coefficient values.

In the case of (b), the implementation as described above for (a) (e.g., an inexpensive CABAC-to-CAVLC transcoder, and extended CAVLC codes) may be used in a transcoder that would be expected to be commercially very viable. Although not absolutely standard compliant, such an-implementation would be capable of perfectly transcoding all non-pathological bitstreams (e.g., all bitstream with residuals only 1 bit deeper than the samples of the original video).

Third, for a non-extended H.264, an inexpensive transcoder cannot correctly transcode all possible CABAC bitstreams that could naturally arise from encoding with very small quantization factors (e.g., very small QPs). Such a video stream would typically occur in applications that use nearly lossless encoding (e.g., non-consumer distribution applications).

In such a case, another variation on the inexpensive CABAC-to-CAVLC transcoder would simply clip transform coefficients from the CABAC stream that are too large to represent in the CAVLC bitstream. For consumer distribution types of applications, the frequency of occurrence of any minor mismatch introduced through such an implementation would be negligible. Such a transcoder would typically only exhibit observable mismatch between the original and transcoded video stream for either pathological bitstreams, or very infrequently for bitstreams used in professional applications that are very nearly lossless.

As mentioned above, part of the present invention presents an ECAVLC (e.g., a proposal to extend the CAVLC codes to be able to represent larger coefficients).

One embodiment adds an additional level prefix code of "16" to the current level prefix codes in H.264 (e.g., a "0" through "15"). The new level prefix code may comprise either a bit string "0000 0000 0000 0000", a bit string "0000 0000 0000 0000 0" or a bit string "0000 0000 0000 0000 1". Decoding a particular bit string indicates that the size of the level suffix is some number bits (e.g., B) that is greater than 12. The number B may be different for each bit depth of video used in the H.264/PExt standard. For internal use in an encoder for H.264, the number B may be 14 bits (to be able to fully represent all possible coefficient values). For (8+X) bit video samples, the number B should typically be (14+X) bits, where X is a positive integer.

A second embodiment may be to redefine the existing level prefix code of "15" (e.g., using bit string "0000 0000 0000 0001" in the H.264 standard). A level suffix of size B bits (as described above) may be implemented rather than the current 12 bits used by the current CAVLC.

A third embodiment may be used to introduce the new level prefix code of "16" as defined above and to change the encoding of the suffix part of the code to be an exponential-Golomb code. In this case, the extended CAVLC code would be capable of representing coefficients with any number of bits and would be immediately applicable to a future standard defining a particular bit depth of samples.

Figure 4:
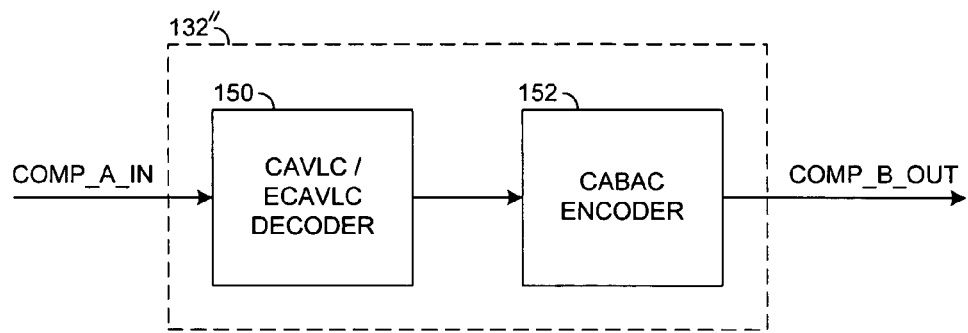
FIG. 4 is a diagram of a transcoder.

Referring to FIG. 4, a diagram of the circuit 132" is shown. The circuit 132" generally comprises a block (or circuit) 150 and a block (or circuit) 152. The block 150 may be implemented as a CAVLC/ECAVLC decoder. A block 152 may be implemented as a CABAC encoder. The block 150 may parse coefficients from the input signal COMP_A_IN by performing a CAVLC or ECAVLC decoding operation. The block 152 may encode the parsed coefficients from the block 150 into the output signal COMP_B_OUT by performing a CABAC encoding operation.

Figure 5:
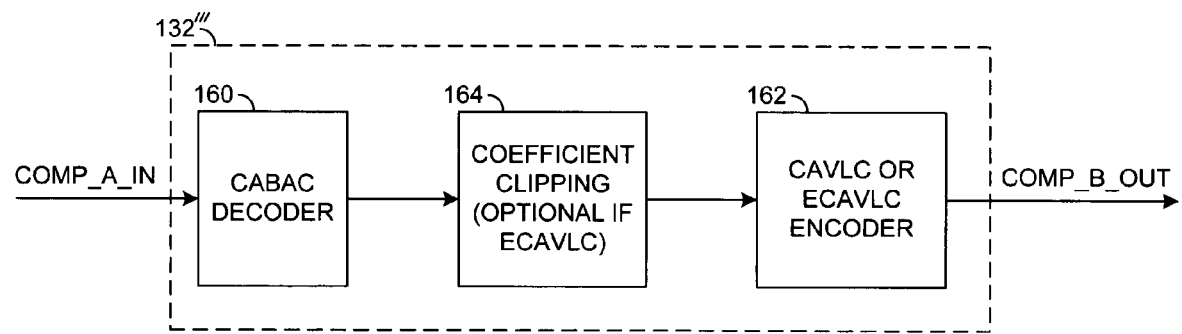
FIG. 5 is a diagram of an alternate implementation of a transcoder.

Referring to FIG. 5, an alternate implementation of the block 132''' is shown. The block 132''' generally comprises a block (or circuit) 160, a block (or circuit) 162, and a block (or circuit) 164. The block 160 may be implemented as a CABAC decoder. The block 162 may be implemented as a CAVLC or ECAVLC encoder. The block 164 may be implemented as a coefficient clipping block.

The block 160 may parse coefficients from the input signal COMP_A_IN by performing a CABAC decoding operation. The block 164 may clip the coefficients if block 162 implements a CAVLC encoding operation. The block 164 may be absent if the block 162 implements an ECAVLC encoding per the present invention. The block 162 may generate the output signal COMP_B_OUT using the parsed and optionally clipped coefficients from the block 160.

Figure 6:
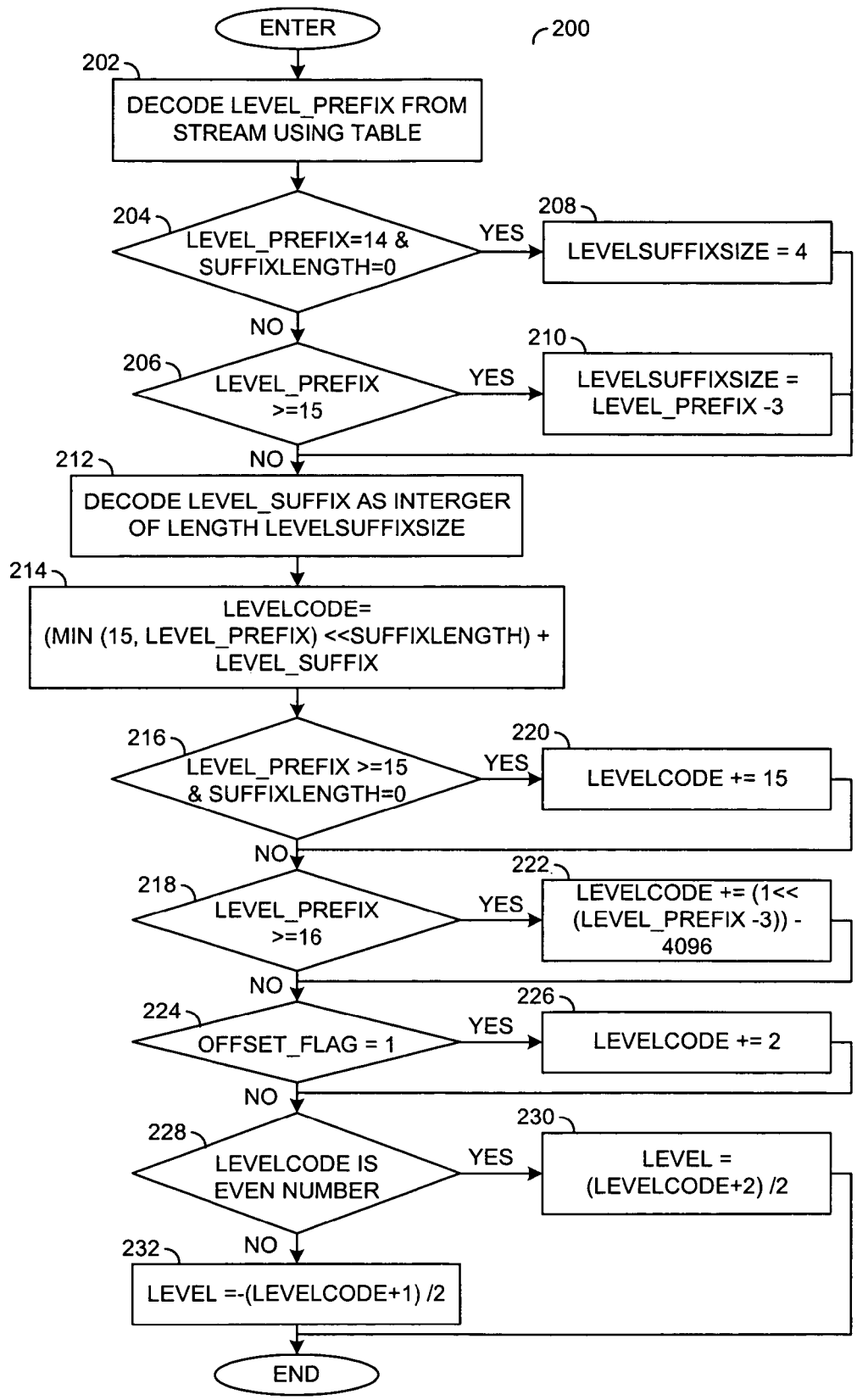
FIG. 6 is a diagram of a process in accordance with the present invention.

Referring to FIG. 6, a method (or process) 200 is shown in accordance with the present invention for parsing one or more ECAVLC coefficients. A variable (e.g., OFFSET_FLAG) may be is true when a level value of a syntax element (e.g., LEVEL) is determined to have a value greater than one. The syntax element LEVEL is an output of the method 200 that may be a signed coefficient level. A syntax element (e.g., SUFFIXLENGTH) is an element that determines which adaptive code to use (e.g., code "0" through code "20") In general, the method 200 may also determine two syntax elements (e.g., LEVEL_PREFIX and LEVEL_SUFFIX). The method 200 generally calculates the level value for the syntax element LEVEL based on the syntax elements LEVEL_PREFIX and LEVEL_SUFFIX. The element LEVEL_PREFIX is generally determined from a bit string in the received stream using TABLE I, TABLE II or a similar table, depending upon a particular implementation. The element LEVEL_PREFIX may convey a CAVLC/ECAVLC syntax element with the left bit first. The element LEVEL_SUFFIX may be an unsigned variable length integer generally conveying a length value calculated within the method 200.

The method 200 generally comprises a state 202, a decision state 204, a decision state 206, a state 208, a state 210, a state 212, a state 214, a decision state 216, a decision state 218, a state 220, a state 222, a decision state 224, a state 226, a decision state 228, a state 230, and a state 232. The state 202 may decode the syntax element LEVEL_PREFIX from a received stream (e.g., COMP_A_IN) in accordance with TABLE I or TABLE II. The decision state 204 determines if both the value of the syntax element LEVEL_PREFIX equals 14 and whether a value of the syntax element SUFFIXLENGTH is equal to zero. If not, the method 200 moves to the decision state 206. If so, the method 200 moves to the state 208 which sets a level suffix size value of a syntax element (e.g., LEVELSUFFIXSIZE) equal to 4. The decision state 206 determines if the syntax element LEVEL_PREFIX has a value greater than or equal to 15. If not, the method 200 moves to the state 212. If so, the method 200 moves to the state 210 which sets the syntax element LEVELSUFFIXSIZE to a value equal to the syntax element LEVEL_PREFIX-3. Next, the state 212 decodes the syntax element LEVEL_SUFFIX as an integer having a length value corresponding to the syntax element LEVELSUFFIXSIZE. Next, the state 214 sets the syntax element LEVELCODE to a value equal to a minimum of either (i) a value of 15 or (ii) the syntax element LEVEL_PREFIX value arithmetically left shifted by a number of binary digits determined by the syntax element SUFFIXLENGTH. The syntax element LEVEL_SUFFIX may subsequently be added to the syntax element LEVELCODE. Addition of the syntax element LEVEL_SUFFIX value to the syntax element LEVELCODE may be skipped if either the syntax element LEVEL_PREFIX has a value greater than 14 or the syntax element SUFFIXLENGTH has a value greater than zero.

Next, the decision state 216 determines if both the syntax element LEVEL_PREFIX have a value greater than or equal to 15 and whether the syntax element SUFFIXLENGTH has a value equal to zero. If not, the method 200 moves to the state 218. If so, the method moves to the state 220. The state 220 sets the syntax element LEVELCODE value equal to the syntax element LEVELCODE+15. Next, the decision state 218 determines whether the syntax element LEVEL_PREFIX has a value greater than or equal to 16. If not, the method 200 moves to the state 224. If so, the method 200 moves to the state 222. The state 222 sets the syntax element LEVELCODE to a value equal to the syntax element LEVELCODE+(1 arithmetically left shifted by. (LEVEL_PREFIX-3) binary digits)-4096. Next, the state 224 determines if the OFFSET_FLAG has a value equal to one. If not, the method 200 moves to the state 228. If so, the method 200 moves to the state 226. The state 226 sets the syntax element LEVELCODE to a value equal to the syntax element LEVELCODE+2. Next, the decision state 228 determines if the syntax element LEVELCODE is an even number. If not (e.g., an odd number), the method 200 moves to the state 232. If so (e.g., an even number), the method 200 moves to the state 230. The state 230 sets the syntax element LEVEL to a value equal to (LEVELCODE+2)÷2. The state 232 sets the syntax element LEVEL to a value equal to -(LEVELCODE+1)÷2. The syntax element LEVEL is normally a signed value. The state 230 and the state 232 generally calculate both the sign and the magnitude of the syntax element LEVEL.

Following the state 232, the method 200 may update the value for the syntax element SUFFIXLENGTH. If the syntax element SUFFIXLENGTH has a value equal to zero, the syntax element SUFFIXLENGTH may be set to a value of one. If both an absolute value of the syntax element LEVEL is greater than a value of 3 arithmetically left shifted by (SUFFIXLENGTH-1) binary digits and SUFFIXLENGTH has a value less than 6, then the syntax element SUFFIXLENGTH may be incremented by one.

The following TABLE I and TABLE II illustrate the decoding of the syntax element LEVEL_PREFIX as described in FIG. 6.

TABLE I

| LEVEL_PREFIX | bit string |
|---|---|
| 0 | 1 |
| 1 | 01 |
| 2 | 001 |
| 3 | 0001 |
| 4 | 0000 1 |
| 5 | 0000 01 |
| 6 | 0000 001 |
| 7 | 0000 0001 |
| 8 | 0000 0000 1 |
| 9 | 0000 0000 01 |
| 10 | 0000 0000 001 |
| 11 | 0000 0000 0001 |

TABLE I-continued

| LEVEL_PREFIX | bit string |
| --- | --- |
| 12 | 0000 0000 0000 1 |
| 13 | 0000 0000 0000 01 |
| 14 | 0000 0000 0000 001 |
| 15 | 0000 0000 0000 0001 |
| 16 | 0000 0000 0000 0000 0 |
| 17 | 0000 0000 0000 0000 10 |
| 18 | 0000 0000 0000 0000 110 |
| 19 | 0000 0000 0000 0000 1110 |
| 20 | 0000 0000 0000 0000 1111 0 |

TABLE II

| LEVEL_PREFIX | bit string |
| --- | --- |
| 0 | 1 |
| 1 | 01 |
| 2 | 001 |
| 3 | 0001 |
| 4 | 0000 1 |
| 5 | 0000 01 |
| 6 | 0000 001 |
| 7 | 0000 0001 |
| 8 | 0000 0000 1 |
| 9 | 0000 0000 01 |
| 10 | 0000 0000 001 |
| 11 | 0000 0000 0001 |
| 12 | 0000 0000 0000 1 |
| 13 | 0000 0000 0000 01 |
| 14 | 0000 0000 0000 001 |
| 15 | 0000 0000 0000 0001 |
| 16 | 0000 0000 0000 0000 1 |
| 17 | 0000 0000 0000 0000 01 |
| 18 | 0000 0000 0000 0000 001 |
| 19 | 0000 0000 0000 0000 0001 |
| 20 | 0000 0000 0000 0000 0000 1 |

The present invention may be used internally in an encoder chip as a proprietary method for internally transcoding between ECAVLC (or CAVLC) and CABAC for H.264 streams. The present invention may be implemented with far less resources than the alternatives for transcoding both external and chip-internal streams from CAVLC-to-CABAC for H.264 and for H.264/PExt. The present invention may be implemented in an encoder to provide the ability to fully produce all valid coefficient values. The present invention may also be valuable as a CAVLC-to-CABAC transcoder for H.264/PExt (if the PExt adopts extended CAVLC codes). The present invention provides an encoder that has the ability to produce a CABAC bitstream that will be guaranteed to be easily transcodable by all cheap CABAC-to-CAVLC H.264 transcoders.

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for transcoding between video streams using different entropy coding, comprising the steps of:
(A) parsing a first video stream with a first circuit using context adaptive binary arithmetic coding codes;
(B) generating a first intermediate signal with said first circuit, said first intermediate signal carrying a plurality of first quantized coefficient values recovered from said first video stream;
(C) generating a plurality of second quantized coefficient values with a second circuit by reducing a bit-depth of particular ones of said first quantized coefficient values received in said first intermediate signal, said particular first quantized coefficient values being represented by greater than a predetermined bit-depth;
(D) generating a second intermediate signal with said second circuit, said second intermediate signal carrying (i) said second quantized coefficient values and (ii) given ones of said first quantized coefficient values, said given first quantized coefficient values being represented by no more than said predetermined bit-depth; and
(E) generating a second video stream with a third circuit by entropy encoding said second intermediate signal, said entropy encoding using a set of entropy codes that is different than said context adaptive binary arithmetic coding codes.

2. The method according to claim 1, wherein said set of entropy codes comprises context adaptive variable length codes.

3. The method according to claim 1, wherein said set of entropy codes comprises context adaptive variable length coding codes extended by a new level prefix code that indicates a new quantized coefficient value having a bit-length of greater than 12 bits.

4. The method according to claim 2, wherein one or more of said first quantized coefficient values are clipped using said second circuit to a range representable by said context adaptive variable length coding codes to generate a respective one or more of said second quantized coefficient values.

5. An apparatus comprising:
a first circuit configured to (i) parse a first video stream using context adaptive binary arithmetic coding codes and (ii) generate a first intermediate signal carrying a plurality of first quantized coefficient values recovered from said first video stream;
a second circuit configured to (i) generated a plurality of second quantized coefficient values by reducing a bit-depth of particular ones of said first quantized coefficient values received in said first intermediate signal, said particular first quantized coefficient values being represented by greater than a predetermined bit-depth and (ii) generate a second intermediate signal carrying (a) said second quantized coefficient values and (b) given ones of said first quantized coefficient values, said given first quantized coefficient values being represented by no more than said predetermined bit-depth; and a third circuit configured to generate a second video stream by entropy encoding said second intermediate signal, said entropy encoding using a set of entropy codes that is different than said context adaptive binary arithmetic coding codes.

6. The apparatus of claim 5, wherein said apparatus is part of a transcoder circuit.

7. The apparatus according to claim 5, wherein said set of entropy codes comprises context adaptive variable length coding codes.

8. The apparatus according to claim 5, wherein said set of entropy codes comprises context adaptive variable length coding codes extended by a new level prefix code that indicates a new quantized coefficient value having a bit- length of greater than 12 bits.

9. The apparatus according to claim 7, wherein said second circuit is configured to clip one or more of said first quantized coefficient values to a range representable by said context adaptive variable length coding codes to generate a respective one or more of said second quantized coefficient values.

10. An apparatus comprising:
means for decoding configured to (i) parse a first video stream using context adaptive binary arithmetic coding codes and (ii) generate a first intermediate signal carrying a plurality of first quantized coefficient values recovered from said first video stream;
means for adjusting configured to (i) generate a plurality of second quantized coefficient values by reducing a bit-depth of particular ones of said first quantized coefficient values received in said first intermediate signal, said particular first Quantized coefficient values being represented by greater than a predetermined bit-depth and (ii) generate a second intermediate signal carrying LI said second quantized coefficient values and (b) given ones of said first quantized coefficient values, said given first quantized coefficient values being represented by no more than said predetermined bit-depth; and
means for encoding configured to generate a second video stream by entropy encoding said second intermediate signal, said entropy encoding using a set of entropy codes that is different than said context adaptive binary arithmetic coding codes.

11. An apparatus comprising:
an encoder configured to generate a compressed video stream by entropy-encoding a signal using a set of codes; and
a storage medium holding said set of codes, said set of codes having (a) sixteen predetermined level prefix codes configured to represent a plurality of coefficient values having bit-lengths of up to 12 bits and (b) at least one new level prefix code configured to represent a new coefficient value having a number B of bits greater than said 12 bits, where (i) said number B is an integer of at least six plus a bit depth of a plurality of pixels, and (ii) said pixels are represented by said compressed video stream.

12. The apparatus according to claim 11, wherein said new level prefix code comprises a bit string beginning with 0000 0000 0000 0000.

13. The apparatus according to claim 11, wherein said new level prefix is configured to represent coefficient values having said bit-length greater than 16 bits.

14. The apparatus according to claim 13, wherein said new level prefix corresponds to a level suffix that comprises an exponential-Golomb code.

15. The apparatus according to claim 11, wherein said set of codes comprises context adaptive variable length codes (CAVLC) extended by said new level prefix code.

16. The apparatus according to claim 11, wherein said compressed video stream comprises one of an H.264 compliant bitstream and an H.264/PExt compliant bitstream.

17. The method according to claim 1, further comprising the steps of:
decoding a plurality of level prefixes from said first video stream based on a table defining greater than 16 of said level prefixes;
calculating a plurality of level suffix sizes based on said level prefixes; and
decoding a plurality of level suffixes as integers of said level suffix sizes.

18. The apparatus according to claim 5, wherein said first circuit is further configured to (i) decode a plurality of level prefixes from said first video stream based on a table defining greater than 16 of said level prefixes, (ii) calculate a plurality of level suffix sizes based on said level prefixes and (iii) decode a plurality of level suffixes as integers of said level suffix sizes.

19. The apparatus according to claim 11, wherein said new level prefix code comprises a bit string 0000 0000 0000 0000 1.

20. The apparatus according to claim 11, wherein said new level prefix code comprises a first bit string 0000 0000 0000 0000 10 and another level prefix code comprises a second bit string 0000 0000 0000 0000 110.

21. The apparatus according to according to claim 10, wherein said set of entropy codes comprises context adaptive variable length coding codes extended by a new level prefix code that indicates a new quantized coefficient value having a bit-length of greater than 12 bits.

22. The apparatus according to claim 10, wherein (i) said set of entropy codes comprises context adaptive variable length coding codes and (ii) said means for adjusting is configured to clip one or more of said first quantized coefficient values to a range representable by said context adaptive variable length coding codes to generate a respective one or more of said second quantized coefficient values.

* * * * *